United States Patent
Huang et al.

(10) Patent No.: US 10,953,641 B2
(45) Date of Patent: Mar. 23, 2021

(54) THERMALLY CONDUCTIVE TYPE POLYIMIDE SUBSTRATE

(71) Applicant: Microcosm Technology Co., Ltd, Tainan (TW)

(72) Inventors: Tang-Chieh Huang, Tainan (TW); Po-Cheng Chen, Tainan (TW)

(73) Assignee: Microcosm Technology Co., Ltd., Tainan (TW)

( * ) Notice: Subject to any disclaimer, the term of this patent is extended or adjusted under 35 U.S.C. 154(b) by 161 days.

(21) Appl. No.: 15/928,994

(22) Filed: Mar. 22, 2018

(65) Prior Publication Data

US 2019/0002641 A1  Jan. 3, 2019

(30) Foreign Application Priority Data

Jun. 30, 2017  (TW) .................................. 106121965

(51) Int. Cl.
*B32B 27/28* (2006.01)
*C08K 3/38* (2006.01)
(Continued)

(52) U.S. Cl.
CPC ............ *B32B 27/281* (2013.01); *B32B 15/08* (2013.01); *C08K 3/28* (2013.01); *C08K 3/36* (2013.01); *C08K 3/38* (2013.01); *H05K 1/0373* (2013.01); *B32B 2260/046* (2013.01); *B32B 2262/106* (2013.01); *B32B 2264/107* (2013.01); *B32B 2264/1021* (2020.08);
(Continued)

(58) Field of Classification Search
CPC ... C08K 3/36; C08K 3/38; C08K 3/28; C08K 2003/385; C08K 2003/282; C08K 2201/001; B32B 27/281; B32B 15/08; B32B 2307/302; B32B 2457/08; B32B 2264/1021; B32B 2264/107; B32B 2262/106; B32B 2260/046; H05K 1/0373; H05K 2201/06; H05K 2201/0275; H05K 2201/0209; H05K 2201/0154; Y10T 428/31721; Y10T 428/31681
See application file for complete search history.

(56) References Cited

U.S. PATENT DOCUMENTS

2008/0176167 A1* 7/2008 Kawamori ............. C09J 179/08
                                                              430/271.1

* cited by examiner

*Primary Examiner* — John D Freeman
(74) *Attorney, Agent, or Firm* — Haverstock & Owens LLP (57) ABSTRACT

A thermally conductive type polyimide substrate is provided. The substrate comprises at least one insulating layer having a metal layer on a single side or both sides thereof. The material of the insulating layer is a thermally conductive type photosensitive resin having a thermal conductivity of 0.4 to 2, and the thermally conductive type photosensitive resin includes the following components: (a) a photosensitive polyimide, (b) an inorganic filler, and (c) a silica solution. The photosensitive polyimide accounts for 50 to 70% of a total weight of a solid composition of the thermally conductive type photosensitive resin. The inorganic filler accounts for 20-30% of the total weight of the solid composition of the thermally conductive type photosensitive resin, and has a particle size between 40 nm and 5 μm. The silica solution comprises silica particles polymerized by a sol-gel process, and the silica particles have a particle size between 10 nm and 15 nm and account for 5 to 30% of the total weight of the solid composition of the thermally conductive type photosensitive resin.

15 Claims, 6 Drawing Sheets

(51) Int. Cl.
    *C08K 3/28* (2006.01)
    *C08K 3/36* (2006.01)
    *B32B 15/08* (2006.01)
    *C08L 79/08* (2006.01)
    *H05K 1/03* (2006.01)
(52) U.S. Cl.
    CPC ..... *B32B 2307/302* (2013.01); *B32B 2457/08* (2013.01); *C08K 2003/282* (2013.01); *C08K 2003/385* (2013.01); *C08K 2201/001* (2013.01); *H05K 2201/0154* (2013.01); *H05K 2201/0209* (2013.01); *H05K 2201/0275* (2013.01); *H05K 2201/06* (2013.01); *Y10T 428/31681* (2015.04); *Y10T 428/31721* (2015.04)

THERMALLY CONDUCTIVE TYPE POLYIMIDE SUBSTRATE

BACKGROUND OF THE INVENTION

Field of the Invention

The present invention discloses a polyimide substrate, and more particularly relates to a polyimide substrate using a thermally conductive type photosensitive polyimide resin as an insulating layer.

Description of the Prior Art

In general, the polyimide resin is prepared from the condensation polymerization of an aromatic tetracarboxylic acid or a derivative thereof with an aromatic diamine or an aromatic diisocyanate. The resulting polyimide resin has excellent heat resistance, chemical resistance, and mechanical and electrical properties, and therefore is widely used in insulating and heat-resistant electronic materials, such as semiconductor sealants.

It is often necessary to form line patterns by using micro lithography when polyimide is applied to the process of semiconductor components. If a conventional polyimide is used, a layer of photoresist must be added additionally for etching. Therefore, since the photosensitive polyimide (PSPI) has both the properties of photoresist and insulation protection materials that can simplify the process and make considerable progress in the flexible panel electronic material process, it is currently a quite popular and advanced material.

However, due to the increasingly intensive circuit design in recent years, the heat generated in the circuit accumulates, resulting in overheating of the product, which becomes an urgent problem to be solved. Currently, the multilayer substrate made of the polyimide having a lower thermal conductivity in the market has been unable to meet the industrial needs.

SUMMARY OF THE INVENTION

The object of the present invention is to provide a thermally conductive type photosensitive resin having a high thermal conductivity and a good photosensitivity, and a thermally conductive type polyimide substrate using the same.

According to an embodiment of the present invention, a thermally conductive type polyimide substrate is provided. The thermally conductive type polyimide substrate comprises at least one insulating layer having a metal layer on a single side or both sides thereof. The material of the insulating layer is a thermally conductive type photosensitive resin having a thermal conductivity of 0.4 to 2 W/mK, and the thermally conductive type photosensitive resin includes the following components (a) a photosensitive polyimide, (b) an inorganic filler, and (c) a silica solution. The unit of the thermal conductivity is W/mK throughout the Present Specification.

The photosensitive polyimide is a polymer or a copolymer composed of a repeating unit of formula (1) below:

wherein m and n are each independently 10 to 600; X is a tetravalent organic group, whose main chain moiety contains an alicyclic compound group; Y is a divalent organic group, whose main chain moiety contains a polydimethylsiloxane group; and Z is a divalent organic group, whose branched moiety contains at least a phenoilc hydroxyl group or a carboxyl group. The photosensitive polyimide accounts for 50 to 70% of a total weight of a solid composition of the thermally conductive type photosensitive resin.

The inorganic filler is selected from at least one of aluminium oxide, graphene, inorganic clay, mica powder, boron nitride, aluminium nitride, silica, zinc oxide, zirconium oxide, carbon nanotube and carbon nanofiber, accounts for 20-30% of the total weight of the solid composition of the thermally conductive type photosensitive resin, and has a particle size between 40 nm and 5 μm.

The silica solution comprises silica particles polymerized by a sol-gel process. The silica particles have a particle size between 10 nm and 15 nm, and account for 5 to 30% of the total weight of the solid composition of the thermally conductive type photosensitive resin.

In an embodiment, the thermally conductive type photosensitive resin described above further includes a photo-crosslinking agent containing an acrylic resin.

In an embodiment, the thermally conductive type photosensitive resin described above further includes a thermal crosslinking agent. The thermal crosslinking agent includes a phenolic compound, an alkoxymethylamine resin, or an epoxy resin, and accounts for 5 to 40% of the total weight of the solid composition of the thermally conductive type photosensitive resin.

In an embodiment, the inorganic filler is boron nitride or aluminum nitride.

In an embodiment, X in the photosensitive polyimide of formula (1) is one of the following groups:

In an embodiment, Y in the photosensitive polyimide of formula (1) is the following group:

in which p=0-20.

In an embodiment, Z in the photosensitive polyimide of formula (1) is one of the following groups:

In an embodiment, the silica particles in the silica solution account for 7.5 to 15% of the total weight of the solid composition of the thermally conductive type photosensitive resin and have a particle size of 10-15 nm.

In an embodiment, the thermally conductive type polyimide substrate further includes a circuit element disposed in the insulating layer and connecting to at least one of the metal layer(s). The circuit element includes an electrical connection pad, a metal post, a metal connecting bracket or a solder wire.

In an embodiment, the thermally conductive type polyimide substrate further includes a protection layer overlaying the outmost metal layer. The material of the protection layer includes a photosensitive ink, a thermosetting ink, a poly(p-phenylene benzobisoxazole) fiber (PBO), a polystyrene-benzocyclobutene copolymer (PSBCB), or a photosensitive development cover film (PIC), or may be the same as that of the insulating layer.

In an embodiment, the thermally conductive type polyimide substrate is multilayer, which includes two or more insulating layers, each of which has a metal layer on one or both of its sides.

In an embodiment, the thermally conductive type polyimide substrate further includes a reinforcing layer, which is a carbon fiber cloth impregnated with the thermally conductive type photosensitive resin.

The foregoing and other aspects of the present invention will become more apparent from the following detailed description of the embodiments in conjunction with the attached drawings. It is to be particularly noted that the compositions, formulations, and structures of the embodiments are only exemplary and are not intended to limit the invention.

BRIEF DESCRIPTION OF THE DRAWINGS

FIGS. 3A and 3B depict the results of comparison between the heat dissipation capacities of the thermally conductive type polyimide substrate of the present invention and the conventional polyimide substrate, in which

DETAILED DESCRIPTION OF THE EMBODIMENTS

The present invention provides a thermally conductive type photosensitive resin, the main component of which is a photosensitive polyimide having a specific molecular structure. By adding the inorganic filler to improve the thermal conductivity and further adding the silica solution to enhance the light penetration effect, the polyimide resin with high thermal conductivity and excellent photosensitivity is obtained.

The thermally conductive type photosensitive resin of the present invention comprises (a) a photosensitive polyimide, (b) an inorganic filler, and (c) a silica solution. The photosensitive polyimide (a) has a structure of formula (1) below:

(1)

In formula (1), m and n are each independently 10 to 600. X is a tetravalent organic group, a main chain moiety of which contains an alicyclic compound group, including (but not limited to) the following groups or a combination thereof:

, and

.

Y is a divalent organic group, preferably containing (but not limited to) the following groups:

p = 0-20

The chain length of Y is preferably short (p=0), and the longest chain length of Y may be p=20. If the chain length is too long, the nature of the photosensitive polyimide will be destroyed.

Z is a divalent organic group, a side chain of which may contain a phenolic hydroxyl group or a carboxyl group. The content of the phenolic hydroxyl group or the carboxyl group approximately accounts for 10 to 30% of the number of moles of the polyimide. The development time may be controlled by adjusting the content of the branched phenolic hydroxyl group or the carboxyl group. When the content of the branched phenolic hydroxyl group or carboxyl group is high, the alkaline developer is preferred for the solubility of the photosensitive polyimide and may improve the developability.

Z may include, but not be limited to, the following groups:

The photosensitive polyimide (a) preferably accounts for 50 to 80% of the total weight of the solid composition of the thermally conductive type photosensitive resin.

The thermally conductive type photosensitive resin of the present invention further comprises (b) an inorganic filler for the main purpose of improving the thermal conductivity of polyimide resin. The inorganic filler may be selected from one or more of aluminium oxide, graphene, inorganic clay, mica powder, boron nitride, silica, aluminium nitride, zinc oxide, zirconium oxide, carbon nanotube and carbon nanofiber, and preferably has a particle size between 40 nm and 5 μm. The inorganic filler preferably accounts for 20-50% of the total weight of the solid composition of the thermally conductive type photosensitive resin.

In addition, a silica solution (colloidal silica) (c) is further added to the thermally conductive type photosensitive resin of the present invention. The silica solution comprises the nanosized silica particles polymerized by the sol-gel method, such as DMAC-ST from Nissan Chemical. The silica particles have a particle size of 10-15 nm. The silica particles in the silica solution preferably accounts for 5 to 30% of the total weight of the solid composition of the thermally conductive type photosensitive resin. In the invention, through adding two kinds of fillers with different particle sizes, the inorganic filler with a relatively large particle size is separated by the silica particles with a smaller particle size such that the interior of the colloid is not masked by the thermally conductive inorganic filler with a relatively large particle size when it is exposed to light, which maintains the resolution of the photosensitive polyimide while the thermally conductive ability is improved.

The thermally conductive type photosensitive resin of the present invention may additionally contain a thermal crosslinking agent with a structure having a phenolic compound or an alkoxymethylamine resin so that the terminal group on the molecular chain of the polyimide form a crosslinked structure with the thermal crosslinking agent during exposure and baking. The acrylic resin photocrosslinking agent can also be added to generate acid after exposure and form an acid-catalyzed crosslinking mechanism. The crosslinked structure thus produced can increase the chemical resistance and film-forming properties of the thermally conductive type photosensitive resin.

The main purpose of the thermal crosslinking agent is to crosslink with the PI backbone-OH group or the ortho position of the terminal-OH group via acid catalysis and heat treatment during hard baking after exposure such that there exists a solubility difference between the exposed and non-exposed areas for facilitating the quick formation of pat- terns. The amount of the thermal crosslinking agent is about 5-40% of the total weight of the solid composition of the thermally conductive type photosensitive resin. If the amount is less than 5%, the crosslinking will be insufficient and the resin won't be resistant to chemical solvents. If the amount exceeds 40%, the developability will be poor.

After exposure and absorption of a certain wavelength of light, the photo-crosslinking agent will generate free radicals to initiate or catalyze the polymerization of the corresponding monomers or prepolymers in order to form crosslinks. The addition amount of the photo-crosslinking agent is 5 to 40% of the total weight of the solid composition of the thermally conductive type photosensitive resin. If it is less than 5%, the photosensitivity is insufficient; and if it exceeds 40%, the developability is poor.

The synthesis steps of the photosensitive polyimide were carried out by dissolving appropriate amounts of the diamine monomer and the dianhydride monomer in 1-Methyl-2-pyrrolidone (NMP), followed by reacting at 80° C. for 2 hours, followed by addition of xylene and heating to 180° C. for distillating. The diamine monomer containing the phenolic hydroxyl group or carboxyl group was further added, followed by reacting at 80° C. for 2 hours, followed by addition of xylene and heating to 180° C. for distillating, and followed by cooling after approximately 4 hours. The method for preparing the thermally conductive type photosensitive resin was carried out by taking the photosensitive polyimide colloid prepared above and then adding the inorganic filler, the silica solution, the photo-crosslinking agent and the thermal crosslinking agent thereto for obtaining the thermally conductive type photosensitive resin of the present invention. (The photo-crosslinking agent and the thermal crosslinking agent may be added optionally.)

Example 1

19.88 g (80 mmol) of 1,3-bis(3-aminopropyl)-1,1,3,3-tetramethyldisiloxane, 80.7 g of 1-methyl-2-pyrrolidone (NMP), and 39.68 g (160 mmol) of bicyclo[2,2,2]oct-7-ene-2,3,5,6-tetracarboxylic dianhydride were added into a 500 ml three-necked round bottom flask equipped with the mechanical stirrer and nitrogen inlet to form a solution. The solution was reacted at 50 to 80° C. for 2 hours. Afterwards, 45 g of xylene was added and then the temperature was risen to 180° C. The mixture was kept stirring for 1.5 hours, and then 21.14 g (80 mmol) of 2-(methacryloyloxy)ethyl 3,5-diaminobenzoate was added. The resulting solution was reacted at 50 to 80° C. for 2 hours, and then 50 g of xylene was added and the temperature was risen to 180° C. The mixture was kept stirring for 4 hours and then cooled to give a PIA-1 solution. 11.38 g of glycidyl methacrylate (GMA) was added into 50 g of the PIA-1 solution, which was then stirred at 70 to 100° C. for 24 hours to give the photosensitive polyimide PSPI-1 of formula (1).

(1)

In the PSPI-1 of formula (1), X is

;

Y is

;

p=0; Z is and m=n=120.

9.375 g of the filler (1 μm boron nitride) and then 23.43 g of 20% silica solution (DMAC-ST from Nissan Chemical, the silica particles of which have a particle size of 10-15 nm) were added sequentially into 75 g of PSPI-1 and mixed uniformly to obtain the thermally conductive type photosensitive resin PSPI-BN1. PSPI-BN1 was coated on the substrate by using a wire bar. After the pre-baking procedure at 90° C. in the oven for 8 minutes, a film having a film thickness of about 15 μm was obtained. The film was then exposed to energy of about 400 mJ/cm² from the exposure machine (having a power of 7 kW) and then developed with 1 wt % (by weight) of sodium carbonate developer for 1 minute. After that, the hard baking procedure was carried out at 200° C. in a nitrogen oven for 2 hours to obtain a developed pattern with heat resistance.

Example 2

12.5 g of the filler (1 μm boron nitride) and then 25 g of 20% silica solution (having a particle size of 10-15 nm) were added sequentially into the PSPI-1 solution of Example 1 and mixed uniformly to obtain the thermally conductive type photosensitive resin PSPI-BN2. PSPI-BN2 was coated on the substrate by using a wire bar. After the pre-baking procedure at 90° C. in the oven for 8 minutes, a film having a film thickness of about 15 μm was obtained. The film was then exposed to energy of about 400 mJ/cm² from the exposure machine (having a power of 7 kW) and then developed with 1 wt % (by weight) of sodium carbonate developer for 1 minute. After that, the hard baking procedure was carried out at 200° C. in a nitrogen oven for 2 hours to obtain a developed pattern with heat resistance.

Example 3

16.07 g of the filler (1 μm boron nitride) and then 26.78 g of 20% silica solution (having a particle size of 10-15 nm) were added sequentially into the PSPI-1 solution of Example 1 and mixed uniformly to obtain the thermally conductive type photosensitive resin PSPI-BN3. PSPI-BN3 was coated on the substrate by using a wire bar. After the pre-baking procedure at 90° C. in the oven for 8 minutes, a film having a film thickness of about 15 μm was obtained. The film was then exposed to energy of about 400 mJ/cm² from the exposure machine (having a power of 7 kW) and then developed with 1 wt % (by weight) of sodium carbonate developer for 1 minute. After that, the hard baking procedure was carried out at 200° C. in a nitrogen oven for 2 hours to obtain a developed pattern with heat resistance.

Example 4

16.07 g of the filler (50 nm boron nitride) and then 26.78 g of 20% silica solution (having a particle size of 10-15 nm) were added sequentially into the PSPI-1 solution of Example 1 and mixed uniformly to obtain the thermally conductive type photosensitive resin PSPI-BN4. PSPI-BN4 was coated on the substrate by using a wire bar. After the pre-baking procedure at 90° C. in the oven for 8 minutes, a film having a film thickness of about 15 μm was obtained. The film was then exposed to energy of about 400 mJ/cm² from the exposure machine (having a power of 7 kW) and then developed with 1 wt % (by weight) of sodium carbonate developer for 1 minute. After that, the hard baking procedure was carried out at 200° C. in a nitrogen oven for 2 hours to obtain a developed pattern with heat resistance.

Example 5

12.5 g of the filler (5 μm aluminium nitride) and then 25 g of 20% silica solution (having a particle size of 10-15 nm) were added sequentially into the PSPI-1 solution of Example 1 and mixed uniformly to obtain the thermally conductive type photosensitive resin PSPI-BN5. PSPI-BN5 was coated on the substrate by using a wire bar. After the pre-baking procedure at 90° C. in the oven for 8 minutes, a film having a film thickness of about 15 μm was obtained. The film was then exposed to energy of about 400 mJ/cm² from the exposure machine (having a power of 7 kW) and then developed with 1 wt % (by weight) of sodium carbonate developer for 1 minute. After that, the hard baking procedure was carried out at 200° C. in a nitrogen oven for 2 hours to obtain a developed pattern with heat resistance.

Comparative Example 1

9.375 g of the filler (1 μm boron nitride) was added into the PSPI-1 solution of Example 1 and mixed uniformly to obtain the thermally conductive type photosensitive resin PSPI-CT1. PSPI-CT1 was coated on the substrate by using a wire bar. After the pre-baking procedure at 90° C. in the oven for 8 minutes, a film having a film thickness of about 15 μm was obtained. The film was then exposed to energy of about 400 mJ/cm² from the exposure machine (having a power of 7 kW) and then developed with 1 wt % (by weight) of sodium carbonate developer for 1 minute. After that, the hard baking procedure was carried out at 200° C. in a nitrogen oven for 2 hours to obtain a developed pattern with heat resistance.

Comparative Example 2

12.5 g of the filler (1 μm boron nitride) was added into the PSPI-1 solution of Example 1 and mixed uniformly to obtain the thermally conductive type photosensitive resin PSPI-CT2. PSPI-CT2 was coated on the substrate by using a wire bar. After the pre-baking procedure at 90° C. in the oven for 8 minutes, a film having a film thickness of about 15 μm was obtained. The film was then exposed to energy of about 400 mJ/cm² from the exposure machine (having a power of 7 kW) and then developed with 1 wt % (by weight) of sodium carbonate developer for 1 minute. After that, the hard baking procedure was carried out at 200° C. in a nitrogen oven for 2 hours to obtain a developed pattern with heat resistance.

Comparative Example 3

16.07 g of the filler (1 μm boron nitride) was added into the PSPI-1 solution of Example 1 and mixed uniformly to obtain the thermally conductive type photosensitive resin PSPI-CT3. PSPI-CT3 was coated on the substrate by using a wire bar. After the pre-baking procedure at 90° C. in the oven for 8 minutes, a film having a film thickness of about 15 μm was obtained. The film was then exposed to energy of about 400 mJ/cm² from the exposure machine (having a power of 7 kW) and then developed with 1 wt % (by weight) of sodium carbonate developer for 1 minute. After that, the hard baking procedure was carried out at 200° C. in a nitrogen oven for 2 hours to obtain a developed pattern with heat resistance.

Comparative Example 4

16.07 g of the filler (50 nm boron nitride) was added into the PSPI-1 solution of Example 1 and mixed uniformly to obtain the thermally conductive type photosensitive resin PSPI-CT4. PSPI-CT4 was coated on the substrate by using a wire bar. After the pre-baking procedure at 90° C. in the oven for 8 minutes, a film having a film thickness of about 15 μm was obtained. The film was then exposed to energy of about 400 mJ/cm² from the exposure machine (having a power of 7 kW) and then developed with 1 wt % (by weight) of sodium carbonate developer for 1 minute. After that, the hard baking procedure was carried out at 200° C. in a nitrogen oven for 2 hours to obtain a developed pattern with heat resistance.

The formulations and properties of the thermally conductive type photosensitive resins of Examples 1-5 and Comparative Examples 1-4 are shown in Table 1:

TABLE 1

Measurements and comparisons of the properties of the thermally conductive type photosensitive resin

| Thermally conductive type photosensitive resin | Percentage of PSPI (wt %) | Inorganic filler | Percentage of inorganic filler (wt %) | Particle size (nm) | Percentage of silica particles (wt %) | Thermal conductivity | Thermal resistance | Resolution* (μm) |
| --- | --- | --- | --- | --- | --- | --- | --- | --- |
| Example 1 | 70 | boron nitride | 20 | 1000 | 10 | 0.467 | 2.6 | 50 |

TABLE 1-continued

Measurements and comparisons of the properties of the thermally conductive type photosensitive resin

| Thermally conductive type photosensitive resin | Percentage of PSPI (wt %) | Inorganic filler | Percentage of inorganic filler (wt %) | Particle size (nm) | Percentage of silica particles (wt %) | Thermal conductivity | Thermal resistance | Resolution* (μm) |
|---|---|---|---|---|---|---|---|---|
| Comparative Example 1 | 80 | boron nitride | 20 | 1000 | 0 | 0.45 | 2.62 | 100 |
| Example 2 | 65 | boron nitride | 25 | 1000 | 10 | 0.513 | 1.73 | 50 |
| Comparative Example 2 | 75 | boron nitride | 25 | 1000 | 0 | 0.499 | 1.84 | 100 |
| Example 3 | 60 | boron nitride | 30 | 1000 | 10 | 0.621 | 1.62 | 75 |
| Comparative Example 3 | 70 | boron nitride | 30 | 1000 | 0 | 0.615 | 1.65 | X |
| Example 4 | 60 | boron nitride | 30 | 50 | 10 | 0.411 | 2.3 | 75 |
| Comparative Example 4 | 70 | boron nitride | 30 | 50 | 0 | 0.19 | 2.3 | X |
| Example 5 | 65 | aluminium nitride | 25 | 5000 | 10 | 0.401 | 2.41 | 75 |

*Resolution means the minimum pattern size that can be achieved and repeated, and a smaller value is preferred.
*All the percentage refer to the weight percentage in the "solid composition" of the thermally conductive type photosensitive resin.

In table 1, percentage of filler refers to the percentage of the weight of the inorganic filler in the solid composition of the thermally conductive type photosensitive resin, and was calculated as the following formula:

$$\%_{filler} = (W_{filler}/W_{solid}) \times 100\%$$

The measurement method of the solid percentage ($\%_{solid}$) is carried out by taking and weighing an appropriate weight of colloid, baking at 200° C. for 90 minutes, and then weighing again after baking to obtain the weight of the solid composition ($W_{solid}$). After the weight of the solid composition is known, the solid percentage can be obtained by calculation using the following formula:

$$\%_{solid} = (W_{solid}/W_{total}) \times 100\%$$

Taking the thermally conductive type photosensitive resin PSPI-BN2 of Example 2 for example, it was formed by adding 12.5 g of the inorganic filler-boron nitride into 75 g of the polyimide PSPI-1 (having a solid percentage of 50%), and thus percentage of the inorganic filler $$(\%_{filler}) = \frac{12.5}{75 \times 50\% + 12.5} = 25\%$$

The thermally conductive type photosensitive resin compositions of Examples 1-4 of the present invention are formed by adding different weight percentages (wt %) of the inorganic filler into the same photosensitive polyimide, with the addition of the same weight percentage of nanosized silica particles (in the form of a silica solution). In contrast, in Comparative Examples 1-4, different weight percentages (wt %) of the inorganic filler are added respectively into the same photosensitive polyimide without the addition of the silica solution. From Table 1 it is known that Examples 1-4, which include the silica solution and have fillers with different particle sizes, show better thermal conductivity, thermal resistance (the smaller is preferred), and resolution performance (the smaller is preferred), as compared with Comparative Examples 1-4 having only single kind of inorganic filler. At the even worse, Comparative Example 3 has no developability at all due to the addition of only one kind of inorganic filler as well as the excessive addition ratio, though the main component is also the photosensitive polyimide. Moreover, although the inorganic filler having a smaller particle size (50 nm) is used, Comparative Example 4 still has no developability due to the excessive addition ratio of the inorganic filler as well as no addition of the silica solution. Both the thermal conductivity and the thermal resistance are also worse. Example 5 uses another kind of the inorganic filler (aluminum nitride) to mix with the silica solution, which equally obtains the effect of high thermal conductivity, low thermal resistance, and excellent resolution. In the invention, through adding the inorganic filler with a relatively large particle size and the silica solution having the silica particles with a smaller particle size, the inorganic filler with a relatively large particle size is separated by the silica particles with a smaller particle size such that the interior of the colloid is not masked by the thermally conductive inorganic filler with a relatively large particle size when it is exposed to light, thereby obtaining the thermally conductive type photosensitive resin having a high thermal conductivity and excellent photosensitivity.

Thermally Conductive Type Polyimide Substrate

The thermally conductive type photosensitive resin of the present invention has various uses due to the advantages of having both the good thermal conductivity effect and high photosensitivity. For example, it can be used as the dielectric material for a thin substrate or a carrier plate for manufacturing the multilayer laminated substrate.

Figure 1:
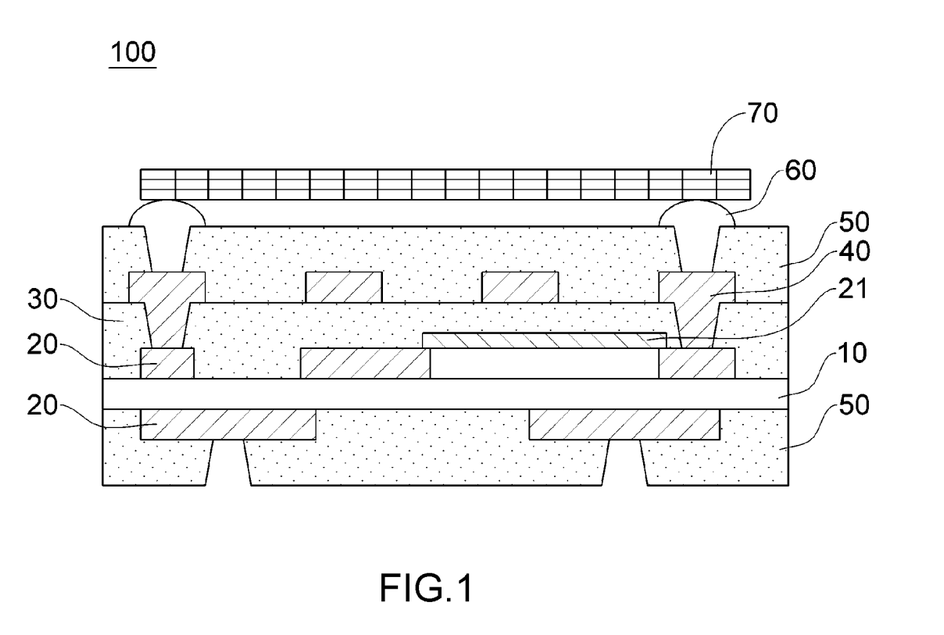
FIG. 1 depicts a schematic view of a thermally conductive type polyimide substrate of the present invention.

FIG. 1 is a schematic view of the thermally conductive type polyimide of the present invention. The structure of the thermally conductive type polyimide substrate 100 includes a substrate 10, metal layers 20, 40, a circuit component 21, an insulating layer 30, and a protection layer 50. The thermally conductive type polyimide substrate 100 may be used as the carrier plate for the semiconductor device and connected to the semiconductor IC 70 through the solder bump 60.

Figure 2A:
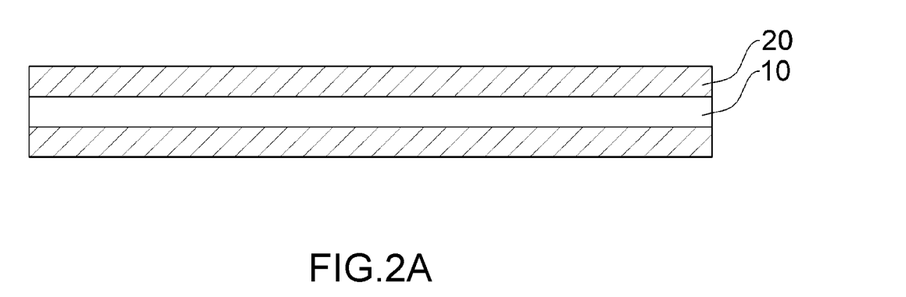
FIGS. 2A to 2F depict a method for manufacturing the thermally conductive type polyimide substrate shown in FIG. 1.

The method for manufacturing the thermally conductive type polyimide substrate 100 will be illustrated below with reference to FIGS. 2A to 2F. First, as shown in FIG. 2A, the substrate 10 is provided. The material of the substrate 10 may include a BT resin substrate, an FR-4 substrate, an FR-5 substrate, an ABF resin substrate, or a FCCL flexible copper foil substrate, etc., and may also be a carbon fiber cloth impregnated with the thermally conductive type photosensitive resin for serving as the reinforcing layer for reinforcing the strength of the thermally conductive type polyimide substrate. The present invention is not limited thereto. Both the upper and lower surfaces of the substrate 10 have the metal layer 20, the material of which may be copper or other electrically conductive material.

Figure 2B:
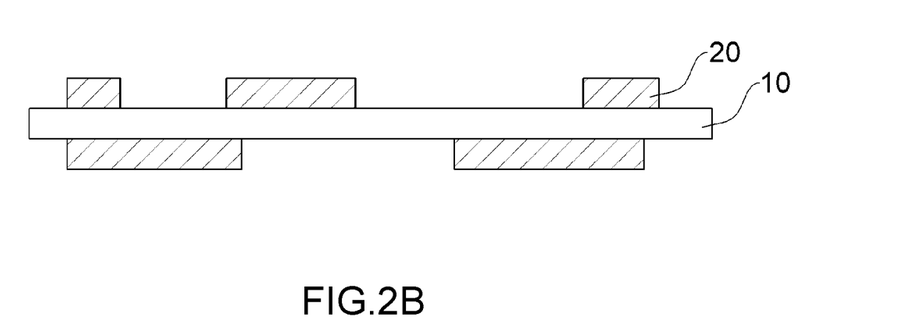

Next, as shown in FIG. 2B, the upper and lower metal layers 20 are patterned to form the desired pattern for the circuit design. The method of patterning may be the conventional photolithography process, and the present invention is not limited thereto.

Figure 2C:
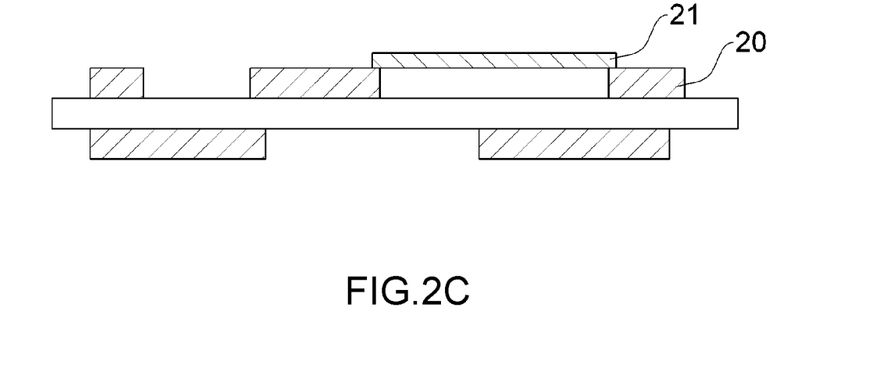

In an embodiment, as shown in FIG. 2C, the circuit element 21 may be placed on the patterned metal layer 20 and may be a passive element, an active element, an electrical connection pad, a metal post, a metal connecting bracket, or a solder wire.

Figure 2D:
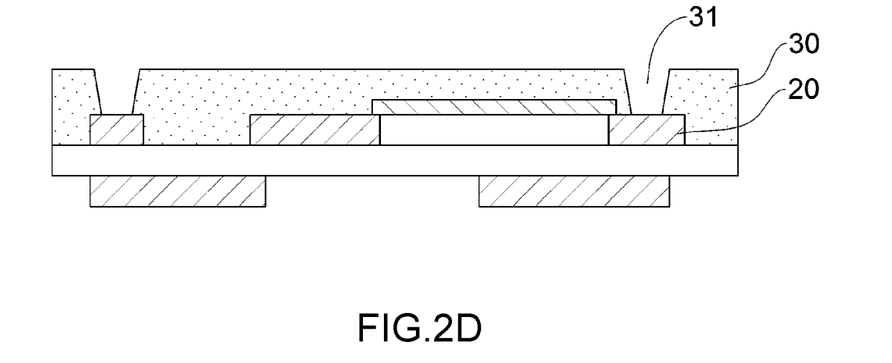

Next, as shown in FIG. 2D, the insulating layer 30 is formed on the substrate 10 and the metal layer 20. The material of the insulating layer is the aforementioned thermally conductive type photosensitive resin, which can be directly exposed and developed without additional use of the photoresist material to form the pattern, and has high thermal conductivity to facilitate the reduction of substrate temperature. The insulating layer 30 may be formed by printing, spin coating, roller coating or laminating, and may be patterned by exposure to UV light and developer removal, thereby forming the via 31.

Figure 2E:
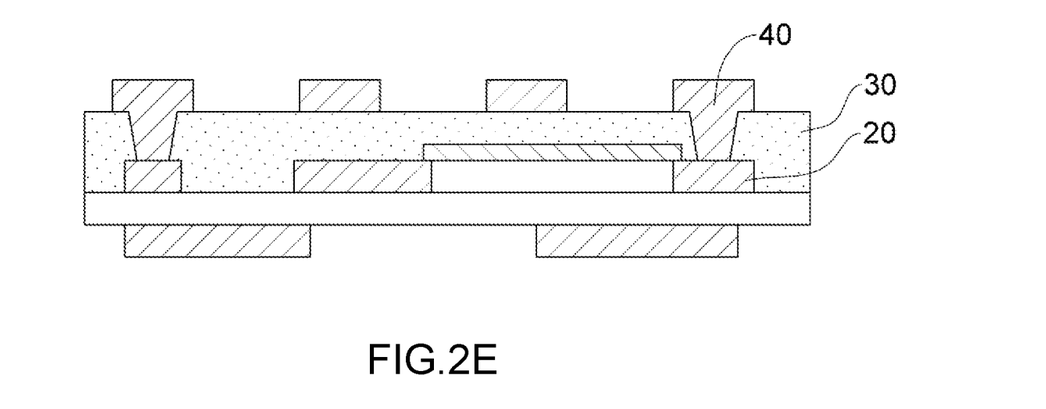

Then, as shown in FIG. 2E, another layer of patterned metal layer 40 is formed on the insulating layer 30. The patterned metal layer is preferably formed by surface metallizing the insulating layer 30 and the via 31 first to form a thin metal layer, which becomes a base for metal formation in subsequent processes and increases the adhesion force. Afterwards, the metal at a specific location is thicken by electroplating in order to form the patterned metal layer 40 having the desired pattern for the circuit design.

Figure 2F:
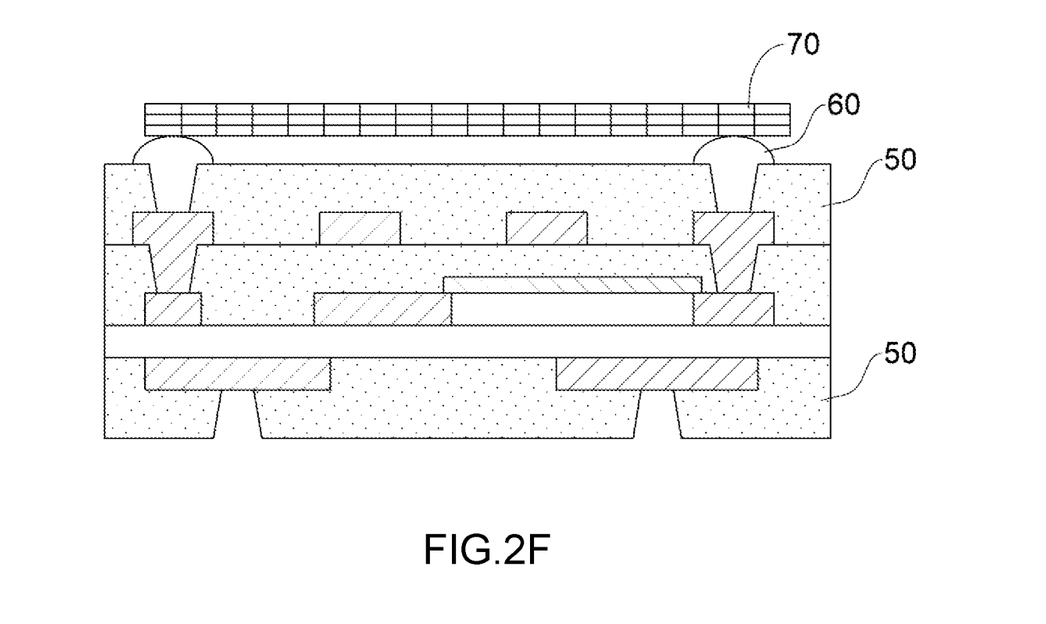

Finally, as shown in FIG. 2F, the protective layer 50 is formed on the outermost metal layers 20 and 40 and then patterned to expose the inner metal layer, and the exposed portions of the metal layers are electrically connected to the semiconductor IC 70 to complete the thermally conductive type polyimide substrate 100 shown in FIG. 1. The manner in which the metal is electrically connected, as shown in FIG. 2F, is flip chip and solder bump 60. However, other methods such as wire bonding can also be employed, and the present invention is not limited thereto. The material of the protection layer 50 may be the same as that of the insulating layer 30, and uses the thermally conductive type photosensitive resin of the present invention. The photosensitive ink, the thermosetting ink, the poly(p-phenylene benzobisoxazole) fiber (PBO), the polystyrene-benzocyclobutene copolymer (PSBCB), or the photosensitive development cover film (PIC) may also be used.

The thermally conductive type polyimide substrate 100 of FIG. 1 includes two metal layers 20, 40. In other embodiments, the process for manufacturing the layer-superimposed structure of FIGS. 2D-2F can be repeated to produce the thermally conductive type polyimide substrate having more layers.

In addition, the thermally conductive type polyimide substrate of the present invention is not necessarily limited to being manufactured by the above-described process, and other conventional semiconductor processes may also be used. As long as the insulating layers between the plurality of metal layers use the thermally conductive type photosensitive resin described in the present invention, it will fall within the scope of the present invention.

Figure 3A:
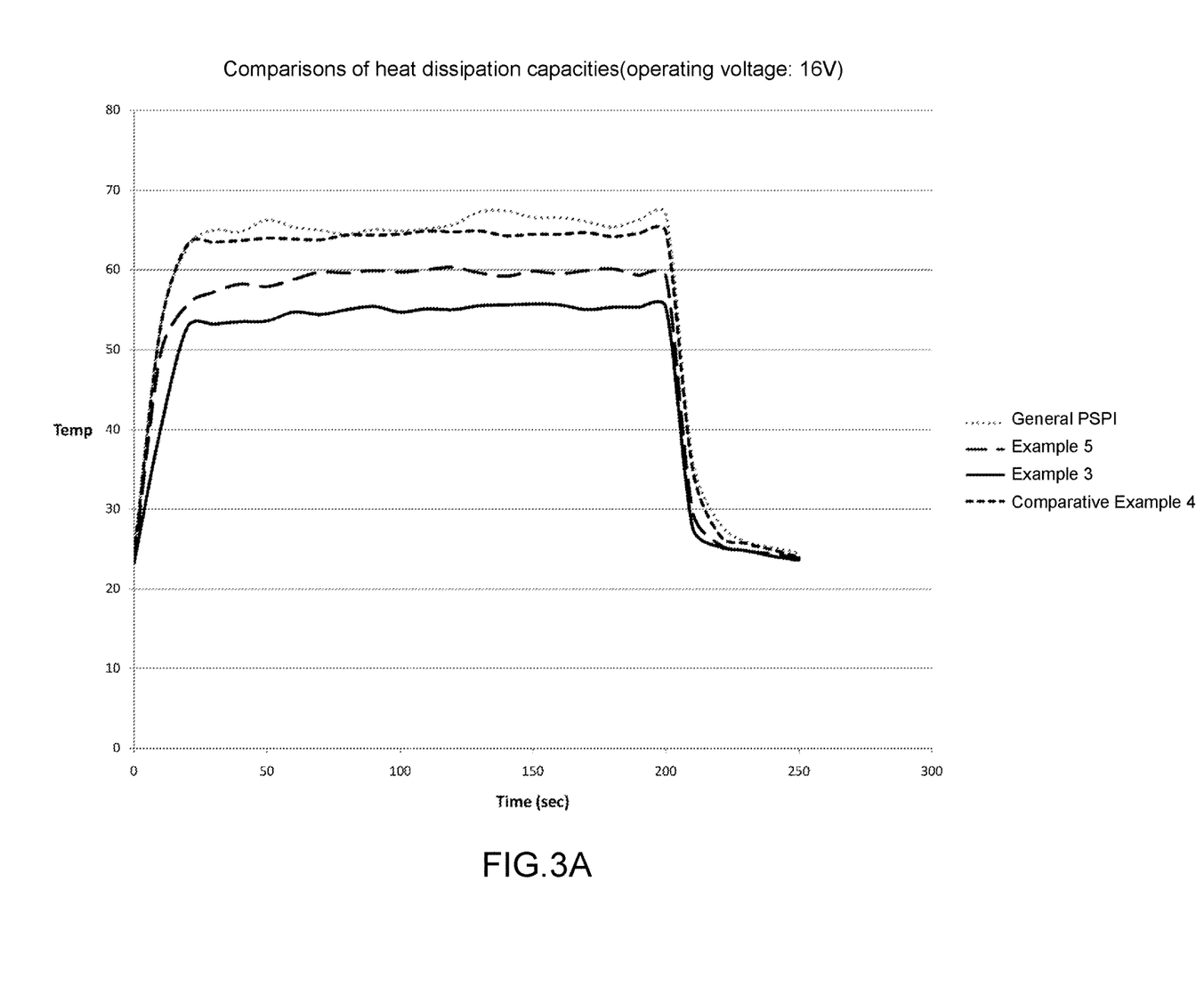
FIG. 3A shows the comparison result of 16 V operating voltage.
Figure 3B:
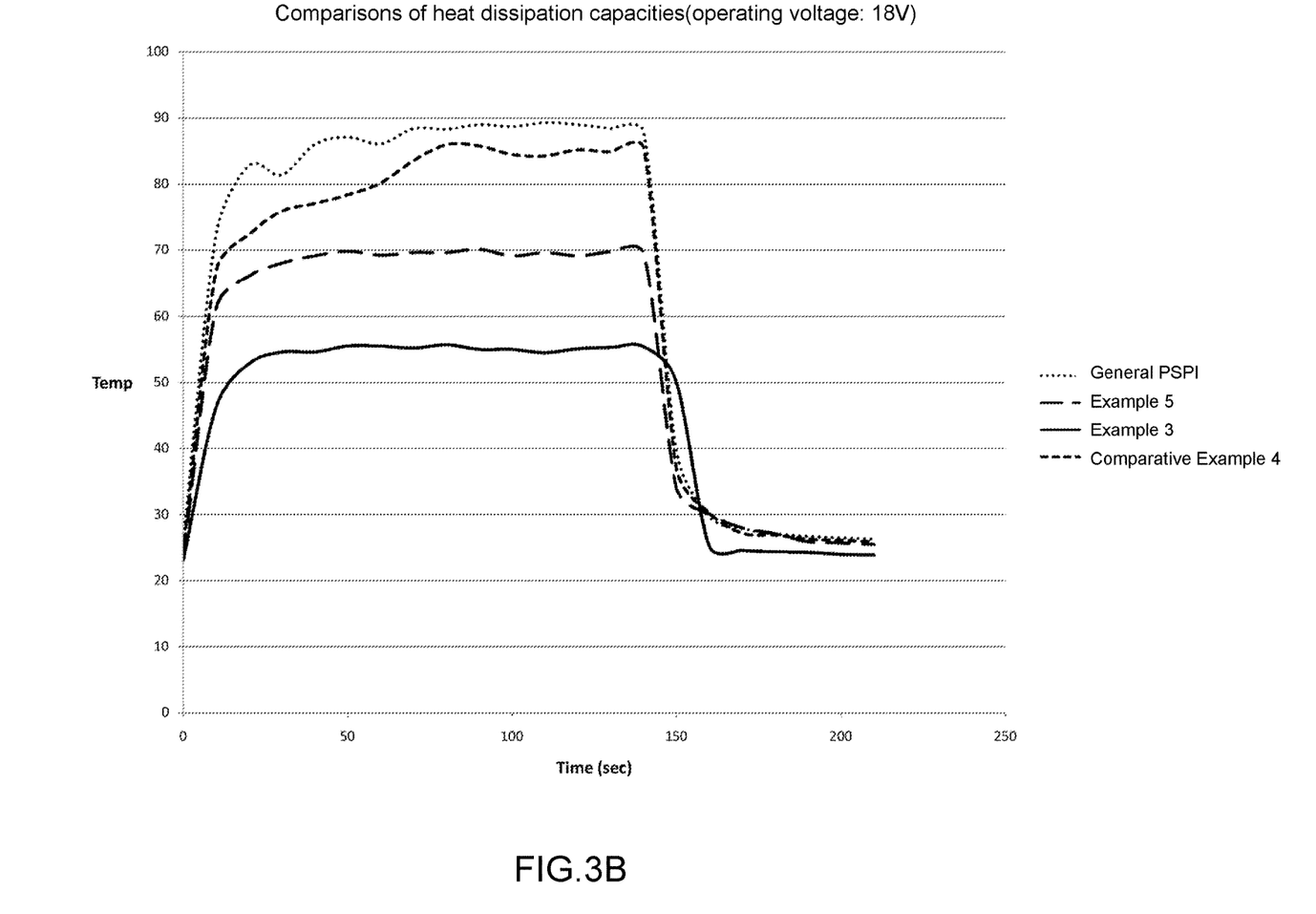
FIG. 3B shows the comparison result of 18 V operating voltage.

FIGS. 3A and 3B compare the heat dissipation capacity of the conventional polyimide substrate with the thermally conductive type polyimide substrate of the present invention. The same heat dissipation elements are disposed in the conventional PSPI substrate (using PSPI as the insulating layer simply) and the substrate using the thermally conductive type photosensitive resin of the present invention as the insulating layer, and an infrared temperature scanner is used to measure the operation temperature of the substrate. In the figure, the thermally conductive type photosensitive resins of Examples 3 and 5 of the present invention and Comparative Example 4 are used. FIG. 3A shows the test result of an operating voltage of 16 V, and FIG. 3B shows the test result of an operating voltage of 18 V. As can be seen from the figure, the polyimide substrate using a single filler (Comparative Example 2, having a thermal conductivity of 0.19) exhibited better heat dissipation effect than the general PSPI substrate (having a thermal conductivity of about 0.1-0.2), but the difference is not significant. However, the thermally conductive type polyimide substrate using the thermally conductive type photosensitive resin of the present invention (Examples 3 and 5) has a very different operating temperature from that of the conventional polyimide substrate. When the operating voltage is high, the difference is more significant, and is even reduced by as much as 40% (90° C. to 55° C.).

The thermally conductive type polyimide substrate of the present invention has a significantly lower operating temperature due to the use of the thermally conductive type photosensitive resin, as compared with the conventional PSPI substrate (having a thermal conductivity of 0.1-0.2). Also, since the photosensitive property is remained, no additional use of photoresist is needed during the patterning process, which can simplify the process and increase the yield.

While the present invention is illustrated above by the embodiments, these embodiments are not intended to limit the invention. Equivalent implementations or alterations may be made to these embodiments by those skilled in the art without departing from the spirit of the art of the invention, and the scope of the present invention should be defined by the appended claims.

What is claimed is:

1. A thermally conductive polyimide substrate, comprising:

at least one insulating layer having a metal layer on a single side or both sides thereof;

the material of the insulating layer being a thermally conductive photosensitive resin having a thermal conductivity of 0.4 to 2 W/mK, and the thermally conductive photosensitive resin including the following components:

(a) a photosensitive polyimide, being a polymer or a copolymer composed of a repeating unit of formula (1) below:

wherein m and n are each independently 10 to 600; X is a tetravalent organic group, whose main chain moiety contains an alicyclic compound group; Y is a divalent organic group, whose main chain moiety contains a polydimethylsiloxane group; Z is a divalent organic group, whose branched moiety contains at least a phenolic hydroxyl group or a carboxyl group, and the photosensitive polyimide accounts for 50 to 70% of a total weight of a solid composition of the thermally conductive photosensitive resin;

(b) an inorganic filler selected from at least one of aluminium oxide, graphene, inorganic clay, mica powder, boron nitride, aluminium nitride, silica, zinc oxide, zirconium oxide, carbon nanotube and carbon nanofiber, accounting for 20-30% of the total weight of the solid composition of the thermally conductive type photosensitive resin, and having a particle size between 40 nm and 5 μm; and

(c) a silica solution comprising silica particles polymerized by a sol-gel process, wherein the silica particles have a particle size between 10 nm and 15 nm, and account for 5 to 30% of the total weight of the solid composition of the thermally conductive photosensitive resin.

2. The thermally conductive polyimide substrate of claim 1, wherein the thermally conductive photosensitive resin further includes a photo-crosslinking agent containing an acrylic resin.

3. The thermally conductive polyimide substrate of claim 1, wherein the thermally conductive photosensitive resin further includes a thermal crosslinking agent, which includes a phenolic compound, an alkoxymethylamine resin, or an epoxy resin.

4. The thermally conductive polyimide substrate of claim 1, wherein the inorganic filler of the thermally conductive photosensitive resin is boron nitride or aluminum nitride.

5. The thermally conductive polyimide substrate of claim 1, wherein X of the thermally conductive photosensitive resin is one of the following groups:

6. The thermally conductive polyimide substrate of claim 1, wherein Y of the thermally conductive photosensitive resin is the following group:

in which p=0-20.

7. The thermally conductive polyimide substrate of claim 1, wherein Z of the thermally conductive photosensitive resin is one of the following groups:

8. The thermally conductive polyimide substrate of claim 1, wherein the silica particles of the silica solution of the thermally conductive photosensitive resin account for 7.5 to 15% of the total weight of the solid composition of the thermally conductive photosensitive resin.

9. The thermally conductive polyimide substrate of claim 1, further including a circuit component disposed in the insulating layer and connecting to at least one of the metal layer(s).

10. The thermally conductive polyimide substrate of claim 9, wherein the circuit element includes an electrical connection pad, a metal post, a metal connecting bracket or a solder wire.

11. The thermally conductive polyimide substrate of claim 1, further including a protection layer overlaying the outmost metal layer.

12. The thermally conductive polyimide substrate of claim 11, wherein the material of the protection layer includes a photosensitive ink, a thermosetting ink, a poly (p-phenylene benzobisoxazole) fiber (PBO), a polystyrene-benzocyclobutene copolymer (PSBCB), or a photosensitive development cover film (PIC).

13. The thermally conductive polyimide substrate of claim 11, wherein the material of the protection layer is the same as that of the insulating layer.

14. The thermally conductive polyimide substrate of claim 1, including two or more insulating layers, each of which has a metal layer on one or both of its sides.

15. The thermally conductive polyimide substrate of claim 1, further including a reinforcing layer, which is a carbon fiber cloth impregnated with the thermally conductive photosensitive resin.

\* \* \* \* \*